(12) United States Patent
Seller et al.

(10) Patent No.: US 8,687,669 B2
(45) Date of Patent: Apr. 1, 2014

(54) AUTOMATIC GAIN CONTROL AND DC OFFSET COMPENSATION

(75) Inventors: Olivier Bernard Andre Seller, Auribeau-sur-Siagne (FR); Nicolas Sornin, La Tronche (FR); Damien Richard Smith, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 397 days.

(21) Appl. No.: 13/063,235

(22) PCT Filed: Aug. 27, 2009

(86) PCT No.: PCT/EP2009/061055
§ 371 (c)(1),
(2), (4) Date: Jun. 20, 2011

(87) PCT Pub. No.: WO2010/028955
PCT Pub. Date: Mar. 18, 2010

(65) Prior Publication Data
US 2011/0286495 A1 Nov. 24, 2011

(30) Foreign Application Priority Data
Sep. 10, 2008 (GB) .................................. 0816571.4

(51) Int. Cl.
*H04L 25/06* (2006.01)
(52) U.S. Cl.
USPC ............................ 375/130; 375/319; 375/318
(58) Field of Classification Search
USPC ......... 375/130, 318, 319, 317, 345, 262, 346; 455/239.1, 234.2; 348/725
See application file for complete search history.

(56) References Cited

U.S. PATENT DOCUMENTS

| | | | |
|---|---|---|---|
| 5,740,524 A | 4/1998 | Pace et al. | |
| 5,805,241 A * | 9/1998 | Limberg | 348/725 |
| 6,212,244 B1* | 4/2001 | Davidovici et al. | 375/345 |
| 6,314,278 B1* | 11/2001 | Zamat | 455/239.1 |
| 6,671,331 B1 | 12/2003 | Sakuma | |
| 2006/0068733 A1 | 3/2006 | Wang et al. | |
| 2006/0159058 A1* | 7/2006 | Johnson | 370/347 |
| 2006/0166633 A1 | 7/2006 | Mehr | |
| 2006/0222116 A1* | 10/2006 | Hughes et al. | 375/345 |

FOREIGN PATENT DOCUMENTS

| | | |
|---|---|---|
| EP | 1083668 A | 3/2001 |
| EP | 1667321 A | 6/2006 |
| WO | 2004-082136 A | 9/2004 |

* cited by examiner

*Primary Examiner* — Shuwang Liu
*Assistant Examiner* — Helene Tayong
(74) *Attorney, Agent, or Firm* — Vorys, Sater, Seymour and Pease LLP; Vincent M DeLuca

(57) ABSTRACT

A signal receiver having a gain control circuit comprising: detection means configured to form a representation of the excess amplitude during a training period of a signal received by the receiver; a first gain stimulus generator configured to generate a first gain stimulus in dependence on the excess amplitude detected by the detection means during the training period; averaging means configured to estimate the average of the signal received by the receiver during the training period; a second gain stimulus generator configured to generate a second gain stimulus in dependence on the average estimated by the averaging means during the training period; and a gain control signal generator configured to generate a gain control signal for the receiver in dependence on the first gain stimulus and the second gain stimulus.

16 Claims, 3 Drawing Sheets

AUTOMATIC GAIN CONTROL AND DC OFFSET COMPENSATION

This invention relates to performing automatic gain control in a receiver in a manner that compensates for DC (direct current) offset. The receiver could, for example, be a receiver for UWB (ultra-wide-band) signals.

FIG. 1 illustrates the first half of the preamble of a UWB frame on a particular one of the ten available time frequency codes. The full preamble is made up of 24 OFDM (orthogonal frequency division multiplexed) symbols. 8 symbols are transmitted on each of the three frequency bands, the transmission of symbols cycling between the bands. Each OFDM symbol lasts 312.5 ns and is composed (as illustrated in FIG. 2) of a burst of data followed by zeros.

During the 24 symbols of the preamble, which last in total for 7.5 ms the receiver needs to perform synchronisation, gain control and DC offset compensation. In order to achieve synchronisation the receiver needs to accumulate a sufficient amount of transformed received signal. Under normal operating conditions, 12 symbols are needed in order for the receiver to synchronise reliably. Since synchronisation must be achieved before gain control and DC offset can be performed reliably, that leaves 12 symbols for those two functions. Gain control and DC offset compensation need to be done independently on each of the three bands, so that means that in total four symbols are available on each of on the three bands for those functions to be done.

One way to perform automatic gain control (AGC) is to take the mean of the 128 non-zero samples of each symbol available for AGC and calculate the energy of that mean. Thus, if the samples are $s_i$, where $0 \le i \le 127$ for the non-zero samples, the estimated energy is:

$$\text{energy} = \sum_{i=0}^{127} |s_i|^2$$

This is repeated for each of the symbols available for AGC. The disadvantage of this method is that it requires the computation of squares, which is a costly operation in time and energy, and it does not readily lend itself to useful programmability of the AGC value in use because it only provides energy information. Moreover, when received signal strength is high, saturation tends to occur, and the energy estimator is not sensitive in the event of saturation.

One known way to perform DC offset compensation is to use a capacitor to compensate for the offset, but that is not practical in the UWB system because the frequency hopping occurs too fast for a capacitor to compensate adequately.

As it is received, each symbol can be sampled at a rate significantly faster than the symbol rate. For example, the symbol can be sampled 165 times, which would yield 128 samples during the non-zero part of the symbol and 37 zero samples. These samples could be, for example, 6-bit I (in phase) and 6-bit Q (quadrature) samples. Another way to perform DC offset compensation is then to develop a DC offset value by iteratively averaging the symbols in each of the symbols available for DC offset estimation. Thus the non-zero symbols in the first symbol available for DC offset compensation (the fifth symbol on a particular band) are averaged to get a first DC offset estimate. That estimate is used when sampling the second symbol available for DC offset compensation (the sixth symbol on a particular band). Then the non-zero samples in that symbol are averaged to get a second DC offset estimate which is used when sampling the third available symbol, and so on until the non-zero samples of the fourth available symbol are estimated to get a final DC offset value to be used for reception of the upcoming UWB frame. The disadvantage of this method is that it will not work reliably if the gain has not already been well set. If the gain has not been well set then the required DC offset might be outside the range that can be achieved using this method.

There is therefore a need for a better way of performing AGC that can more accurately compensate for DC offset, especially but not exclusively in systems like the one described above.

According to a first aspect of the present invention there is provided a signal receiver having a gain control circuit comprising: detection means configured to form a representation of the excess amplitude during a training period of a signal received by the receiver; a first gain stimulus generator configured to generate a first gain stimulus in dependence on the excess amplitude detected by the detection means during the training period; averaging means configured to estimate the average of the signal received by the receiver during the training period; a second gain stimulus generator configured to generate a second gain stimulus in dependence on the average estimated by the averaging means during the training period; and a gain control signal generator configured to generate a gain control signal for the receiver in dependence on the first gain stimulus and the second gain stimulus.

The receiver may further comprise an amplifier for amplifying received signals, the amplifier being configured to apply a level of gain that is dependent on the gain control signal.

Preferably the receiver is configured to process two receive phase signals; the detection means is configured to identify for each phase signal: (a) the number of samples during a part of the training period for which that phase signal exceeds a first threshold, (b) the number of samples during the part of the training period for which that phase signal is below minus the first threshold, and to determine for each phase signal a respective minimum value that is equal to the smaller of those numbers of samples; and to form the representation of the excess amplitude in dependence on those minimum values.

Preferably the detection means is configured to form the representation of the excess amplitude as the larger of the two minimum values.

Preferably the averaging means is configured to estimate the average of the signal received by the receiver during the training period as being the average over the said part of the training period of the phase signal whose minimum value is the larger.

Suitably one of the receive phase signals is an in-phase signal and one of the receive phase signals is a quadrature signal.

Preferably the first gain stimulus generator is configured to generate the first gain stimulus such that it is at least approximately proportional to the inverse error function of the representation of the excess amplitude. Preferably the first gain stimulus detector comprises a look-up table configured to output the first gain stimulus in response to receiving the representation of the excess amplitude.

Preferably the second gain stimulus detector is configured to generate the second gain stimulus such that it is at least approximately proportional to the error function of the average estimated by the averaging means during the training period. Preferably the second gain stimulus detector comprises a look-up table configured to output the second gain stimulus in response to receiving the average estimated by the averaging means during the training period.

Preferably the gain control signal generator is configured to generate the gain control signal for the receiver by summing the first gain stimulus and the second gain stimulus.

The receiver may further comprise means for performing DC offset compensation in dependence on the signal received during the said training period.

Optionally, the detection means is configured to identify the minimum amplitudes during each of a series of training periods of the signal received by the receiver; the first gain stimulus generator is configured to generate a series of first gain stimuli, each being generated in dependence on the minimum amplitude identified by the detection means during a respective training period; the averaging means is configured to estimate the average of the or each signal whose gain is to be controlled by the circuit as received by the receiver during each training period; the second gain stimulus generator is configured to generate a series of second gain stimuli, each being generated in dependence on the average estimated by the averaging means during a respective training period; and the gain control signal generator is configured to generate a series of gain control signals for the receiver in dependence on the first gain stimulus and the second gain stimulus dependent on the signal received during a respective training period.

Suitably the receiver is for receiving signal frames composed of a series of training periods followed by traffic data, and the receiver is configured to use the gain control signal generated by the gain control signal generator in dependence on the first gain stimulus and the second gain stimulus dependent on the signal received during the final training period of a frame for reception of the traffic data of the frame. Preferably each training period occupies a part of a training symbol of the received signal.

The receiver may be a UWB signal receiver.

According to a second aspect of the present invention there is provided a method for receiving a signal by means of a signal receiver having a gain control circuit, the method comprising: forming a representation of the excess amplitude during a training period of a signal received by the receiver; generating a first gain stimulus in dependence on the excess amplitude detected during the training period; estimating the average of the signal received by the receiver during the training period; generating a second gain stimulus in dependence on the average estimated during the training period; and generating a gain control signal for the receiver in dependence on the first gain stimulus and the second gain stimulus.

The present invention will now be described by way of example with reference to the accompanying drawings. In the drawings.

Figure 1:
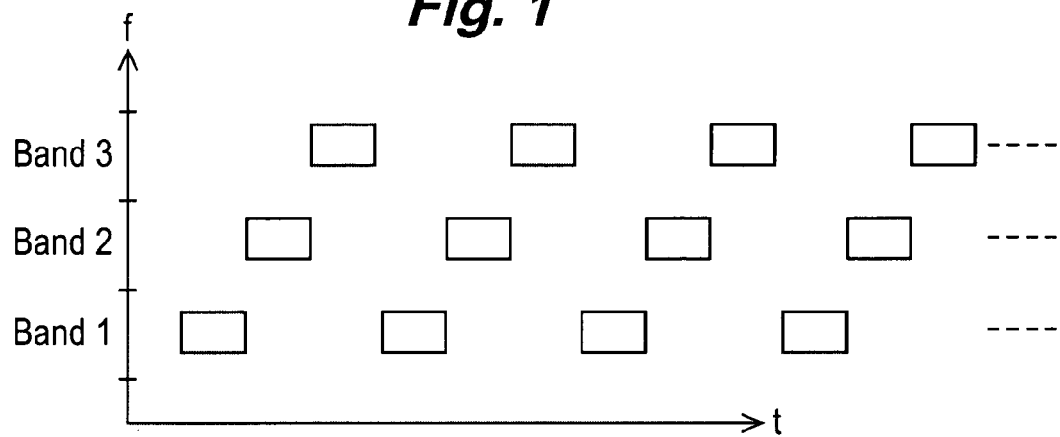
FIG. 1 shows part of the preamble of a UWB frame.
Figure 2:
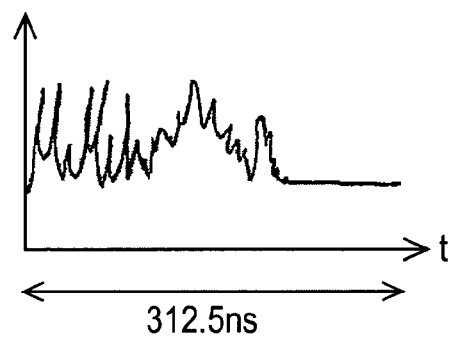
FIG. 2 shows a symbol of a UWB frame's preamble.
Figure 3:
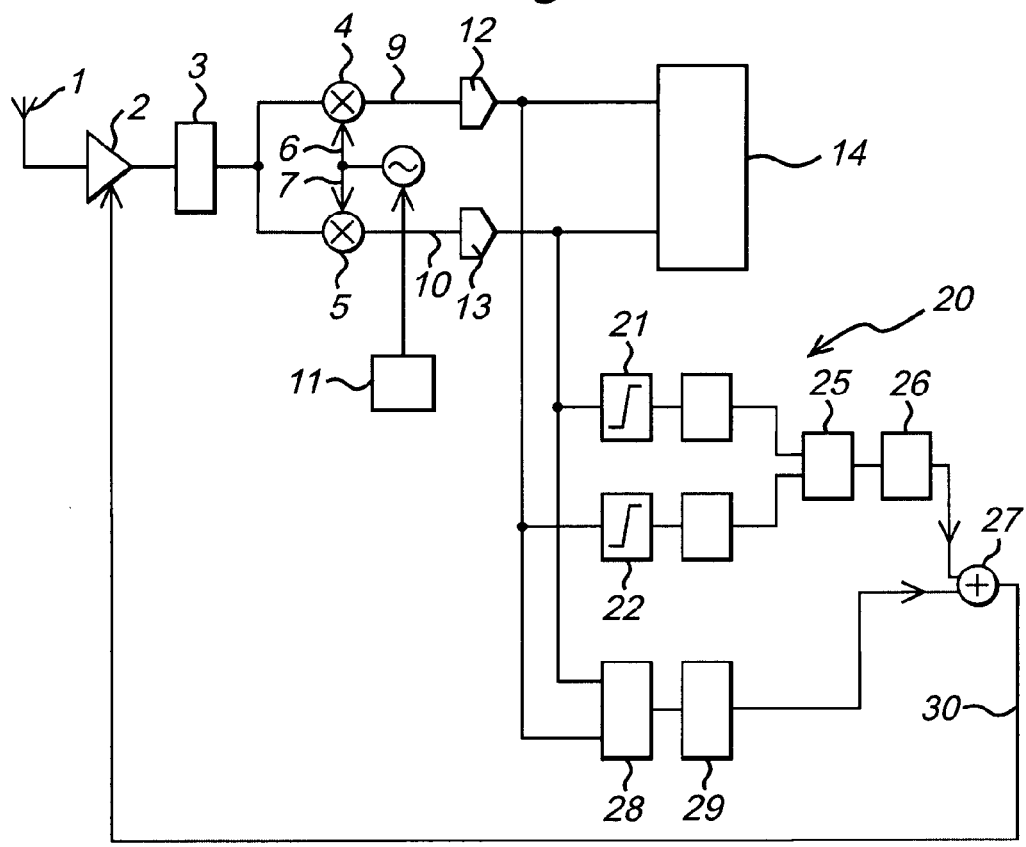
FIG. 3 shows schematically an AGC and DC offset processing circuit in a UWB receiver.

The receiver of FIG. 3 comprises an antenna 1, an amplifier 2 and a filter 3 for receiving, amplifying and bandpass filtering a received signal. The signal is then split and passed to mixers 4 and 5. The mixers mix the received signal with in-phase 6 and quadrature 7 signals from a local oscillator 8 to produce received I and Q signals at 9 and 10 respectively. The local oscillator is controlled by a control circuit 11 to generate an appropriate signal for mixing the current UWB band to a desired frequency band for further processing. The received I and Q signals are then sampled in analogue to digital converters 12, 13 and passed to a baseband section 14 for further processing. In this example, the A to D converters operate at a sample rate of 165 samples in the 312.5 ns length of a UWB symbol and generate 6 bits per sample.

When the preamble of a frame is being received, and at least a preliminary synchronisation has been achieved, AGC and DC offset setting is performed on the remaining 12 symbols (4 per band) by the circuit shown generally at 20.

The received and sampled I and Q signals pass to respective threshold detectors 21, 22. The thresholds of these detectors may be fixed, for example at the mid-range of the available sample range, but may be adjustable as is described in more detail below.

The threshold detectors trigger four counters in decision unit 25, which count the threshold events as follows:

Counter A: counts samples for which the I signal is greater than a pre-set threshold, Counter B: counts samples for which the I signal is smaller than minus the pre-set threshold Counter C: counts samples for which the Q signal is greater than a second pre-set threshold (which may be the same as the first pre-set threshold)

Counter D: counts samples for which the Q signal is smaller than minus the second threshold The decision unit then selects min(A,B) for the I signal, and min (C,D) for the Q signal as representing the respective signal's sigma. Note that in the absence of possible DC either A, B, or (A+B)/2 could be taken as an estimate of the I signal sigma (and analogously for C, D and Q). However, in the presence of DC offset, one of A or B will be bigger than the other, possibly due to saturation, so the minimum gives better information on signal sigma.

This threshold detection is performed over a non-zero part of the signal, i.e. a non-zero part as estimated by the synchroniser. The synchroniser may be wrong, so to be sure of processing non-zero signal this window can be reduced, e.g. to 100 samples instead of 128, to be sure of processing actual signal.

The sigma estimates for both the I and Q signals during the current symbol are passed to a decision unit 25 which selects and outputs the maximum of those estimates. This output represents the magnitude of the higher minimum of the I and Q signals during the symbol. Since this number will be used for setting the gain for subsequent reception steps, selecting the maximum in this way reduces the chance of saturating the stronger of the I and Q signals.

The selected minimum is then passed as input to a first look-up table 26. In response to that input the first look-up table outputs a value that is dependent on the pre-programmed content of the first look-up table. That output represents a first gain change stimulus and is provided to a summation unit 27. The first look-up table preferably implements an inverse error function (inverse Gaussian) curve, so that the output is approximately proportional to the reciprocal function of the integral of a Gaussian curve between a chosen threshold and positive infinity.

In parallel with the steps described above, the received I and Q samples are passed to an averaging unit 28 that averages them over the course of a symbol or a selected part (e.g. the non-zero part) of it. Ideally the computation window will take all 128 samples, but to account for possible synchronisation errors the window could be narrowed. The averaging unit could digitally sum the samples and divide them by the number of samples. In an alternative embodiment it could be implemented in analogue by means of a capacitor that is charged to a level that is dependent on all the signals received during the selected time period. Separate averages for independent DC offset compensation on I and Q on each band are computed. This gives 6 real (or 3 complex) numbers. For each band, one of the computed averages is selected, depending on whether the outputs of counters NB or of counters C/D were selected in the previous step. The I average is passed to second look-up table 29 if counter A or B was chosen, or the Q average is passed to look-up table 29 if counter C or D was chosen. In response to that input the second look-up table 29 outputs a value that is dependent on the pre-programmed content of the second look-up table. The second look-up table preferably implements a curve such as to adjust the output of the first look-up table in a way that implements an appropriate change in threshold to the sum of the threshold and the DC offset in the integral. That output represents a second gain change stimulus and is provided to the summation unit 27.

The summation unit 27 sums the first and second gain change stimuli to generate a gain change command signal at 30. The gain change command signal is output to the amplifier 2 in order to control the amplification it applies and thereby implement gain control on the received signal.

By summing the stimuli from the upper "maximum minimum" path of FIG. 3 and the lower "average" path of FIG. 3, the circuit of FIG. 3 can implement automatic gain control with relative immunity from DC offsets. The gain control stimulus derived from the "average" path compensates for non-zero DC offset in the received signal, adjusting the final gain change command signal so it is relatively insensitive to DC offset.

This insensitivity has a further advantage in that it allows the receiver to compensate for DC offset and perform AGC in parallel on the same symbols from the preamble. This allows the circuit to achieve relatively accurate DC offset and AGC settings for the ensuing frame despite there being only a small number of symbols available for training. For the ensuing frame the common/"average" path is used to estimate DC offset.

Figure 4:
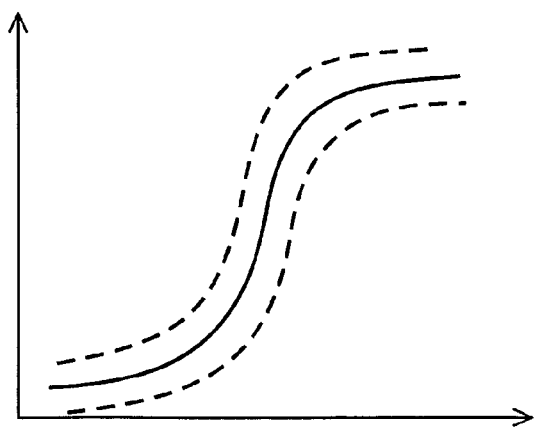
FIG. 4 illustrates in simplified form a function utilised in the circuit of FIG. 3.

FIG. 4 shows the simplified form of expected sample values (on the y axis) for a range of received amplitudes for I and Q signals (on the x axis). The slope is greatest in the central region of the curve, so that region represents the region in which the receiver is most sensitive. The figure also illustrates the confidence interval about the actual line. The objective of the automatic gain control is to shift the I and Q signals so that their central amplitude values lie in the most sensitive region of this curve. To achieve this efficiently it is preferred that the real look-up table 26 implements an error function (inverse Gaussian) curve, outputting a value that is approximately proportional to the error function of the input. This function is the inverse of the curve shown in FIG. 4. As with look-up table 29, the function could be implemented by calculation instead of by a look-up table, but a lookup table is more efficient given the small time available following each symbol.

Figure 5:
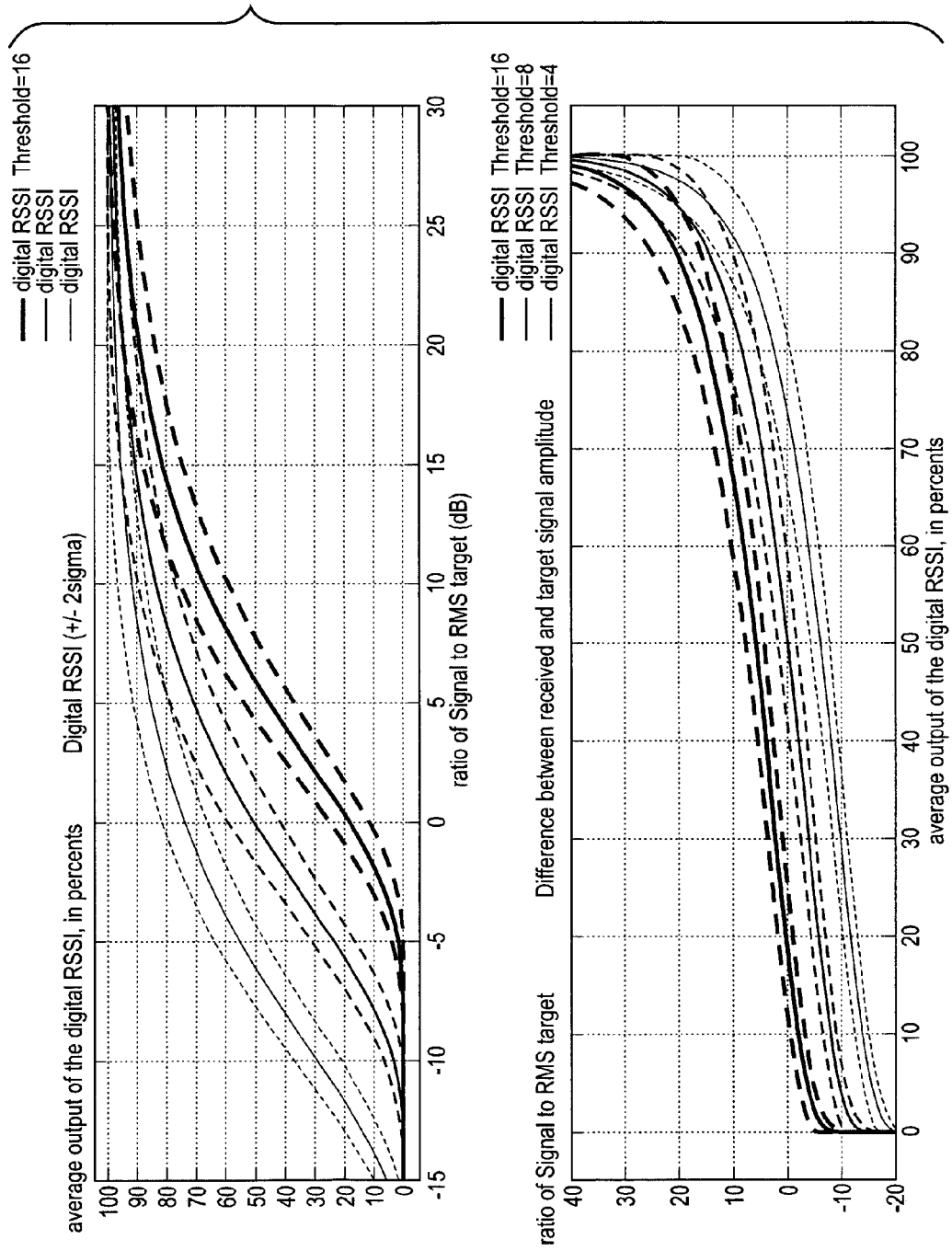
FIG. 5 illustrates an example of that function in more detail.

FIG. 5 shows in more detail curves analogous to that of FIG. 4. For the example of FIG. 5 the following parameters were chosen:

Digital RSSI=min(counter A, counter B)*2/128*100
Window of size=128
6 bit ADC
target signal amplitude=12LSB RMS. That is to say that if each I or Q sample is an integer within, say, the range from −32 to +31, the target is to get mean(I)=0 (i.e. no DC), and stdev(I)=12.

The upper graph of FIG. 5 shows received signal amplitude relative to the RSS target (on the x axis) against average RSSI output (%) (on the y axis). The objective is for the received signal amplitude relative to RMS target to be 0 dB. In the region to the right of the graph the signal is too high. To the left it is too low. The curves plotted on the graph show three sets of RSSI behaviours in a similar fashion to FIG. 4. From upper to lower, these are for the digital RSSI thresholds of 16, 8 and 4 respectively.

The lower graph of FIG. 5 shows average RSSI output (%) (on the x axis) against the ration of the received signal amplitude to the RMS targed (on the y axis). Again, the three sets of curves plotted on the graph show three sets of RSSI behaviours in a similar fashion to FIG. 4. From upper to lower, these are for the digital RSSI thresholds of 16, 8 and 4 respectively. Thus, suppose for examples that threshold=16 is being used, and in the course of reception counter A=58 and counter B=58. That means digital RSSI is estimated as around 90%. ((58+58)/128*100). If the curves for threshold 16 (upper curves) are in use then a digital RSSI of 90% would say that signal is 20 dB too strong, with a confidence interval between +16 dB and +24 dB. The look up table for entry 58 would hence be configured to indicate a gain decrease of 20 dB. It will me noted that threshold=16 is good for detection when the received signal is too high.

Alternatively, suppose that threshold=4 is being used, and in the course of reception counter A=6 and counter B=6. That means digital RSSI is estimated as around 10%. ((6+6)/128*100).count 6 crossing for both counters A and B, so that Digital RSSI=10%. If the curves for threshold 4 (lower crves) are in use then a digital RSSI of 10% would say that signal is 14 dB too low, with confidence interval between 12 dB and 16 dB. The look up table for entry 6 would hence be configured to indicate a gain increase of 14 dB. It will be noted that threshold=4 is good for detection when the received signal is too low.

Of course it is unlikely that the receiver will know in advance if the signal is going to be too low or too high, so the selection of threshold is a trade-off.

In the UWB receiver the final AGC value will be approached automatically through the four available iterations of the process described above, as successive training symbols are received.

To obtain greater control and to allow the system to be adapted to receive conditions or to artefacts of the receiver circuit it is advantageous to design the circuit so that the threshold level used by the threshold detectors 21, 22 can be set programmatically in use, for example with the aim of improving or maximising sensitivity. The threshold value is pre-programmed into the system and is not selected in real time. It is set to a suitable value depending on the AGC target, data rate and expected interferer conditions.

In summary, one example of the above system operates as follows.

AGC is implemented in the analogue receive chain of a receiver during reception of the 24 OFDM symbols of the preamble of a packet. At the end of the preamble the AGC is locked for the remainder of the packet. Any changes in gain during reception of the packet's payload would cause phase changes that would damage demodulation of the signal.

The general operation of the example system is as follows.

1. When the receiver is enabled to receive a packet, Frequency hopping of the local oscillator of the receiver is initially disabled so a specific sub-band is received continuously. Some component of the RE receive chain (e.g. the VGAs and ADCs) can be disabled to reduce power consumption. The baseband filters might be disabled depending on whether the input to the preamble detect comparator is before or after the filters.

2. Initially the LNA gain is set to full gain. For a short period after enabling the receiver (conveniently for about 3 OFDM symbols or 1 μsec) the wideband RSSI is monitored and the LNA may be switched to low gain. After this time period the LNA gain is locked until the preamble is detected. The reason for this is that it may be needed to keep LNA gain low in the presence of a strong interferer but also to not change the LNA gain during the preamble correlation process as the resulting phase change could prevent correlation being achieved.

3. Preamble detection is performed on the first 10 symbols of the preamble (since the LO is not frequency hopping at this stage only 4 symbols might actually be received).

4. When the preamble is detected, a decision on the LNA gain is taken based on the previous wideband RSSI measurements. The LNA gain is then locked for the remainder of the preamble and the packet payload. The same LNA gain is used for all sub-bands.

5. The LO starts frequency-hopping based on coarse OFDM symbol timing elicited from the preamble detection phase. The full baseband receive chain is enabled (ADC, VGA and filter). The preamble synchroniser restarts correlation (so any phase changes due to the LNA gain change do not matter) but since the LO is now frequency hopping all symbols can be used in the correlation process allowing more accurate time and frequency error estimates to be derived.

6. During each OFDM symbol the narrowband RSSI is (indirectly) measured. At the end of the symbol this measure is mapped onto a VGA gain index change, using a look-up table. This gain index change can be corrected using other measures.

7. The gain index changed is mapped onto a change in the VGA gains for that subband, via a second look-up table that maps a gain index to the actual VGA gain settings. Separate VGA gains are maintained for each subband. Since 13 OFDM symbols are allocated to AGC operation and these may cover 3 subbands, for optimal performance the AGC for each subband should be able to settle in 4 symbols.

8. When the end of the preamble is reached, the AGC is locked. The VGA gains for each subband are automatically applied to the analogue receiver components during the symbol-rate frequency-hopping in the packet payload. The VGA gains for each band should be passed to the modem. They will be used for soft bits weighting before the Viterbi equaliser of the receiver.

In this example system, the AGC procedure operates as follows.

1. The AGC procedure is symbol based, and is implemented in two steps:

At the end of each OFDM symbol a the gain for the current band is updated

At the beginning of each symbol (indeed just before the beginning), the gain for the current channel is formed in dependence on the last update for the current band and the last updates for the two other bands. The gain for the current channel is formed by systematically combining those values, using programmable coefficients. By this route the output of the procedure can range from band independence to common gain settings, with hybrids of the two also possible.

2. Gain change, per band. During each OFDM symbol the narrowband RSSI is indirectly measured by counting threshold crossing events at the output of the ADCs. The threshold is configurable. The events are counted for positive and negative crossings, and the minimum of those two values is kept. This accumulation of values is performed in parallel for I and Q, then the maximum among I and Q is taken as the indicator of digital RSSI for that symbol.

3. This measure is mapped onto a VGA gain index change, using a look-up table. The look-up table is programmable, and approximates an inverse erf function.

4. This gain index change is then corrected using a second look-up table indexed by the average of the symbol (I or Q depending on which has been selected as digital RSSI indicator).

5. Then, to enhance the performances of the AGC in the presence of a sinusoidal interferer, the gain index change can be corrected if no signal crosses two thresholds, with 16 and 24 as default values.

6. Finally, a heuristic operation may be performed to inhibit the AGC from hunting, and to avoid small gain changes during the last symbol of the preamble. There might be a significant residual error of DC offset in the gain dependant look-up table. If so, it is better not to change the gain and rather correct for this DC Offset.

7. Once the gain change has been performed for band N, the gain for band N+1 is changed. Note that band N+1 gain was already changed 3 OFDM symbols before, according to the procedure described above (gain change, per band). The new band N+1 change is a combination of current gains for bands N, N−1, N+1. The combination coefficients are programmable. For instance, they could be configured in one of the following ways:

[0 0 16] AGC is performed independently for each band. This is the default mode and uses coefficients of [0/16, 0/16, 16/16].

[16 0 0] AGC is performed almost uniformly over the 3 bands. Convergence is 3 times faster (assuming identical signal power over the 3 bands) as the updated gain for the current symbol is used for the next one, regardless of band. Coefficients are [16/16, 0/16, 0/16].

Modes using combinations of coefficients such as [5 5 6], [4 4 8] or [2 2 12] give modes with varying degrees of combining, so the gain setting has a degree of influence from the preceding symbols and from the gain previously used for the current band.

8. The combination is rounded to the nearest integer to find the new gain index. It is this gain index that will actually be used by the analogue RX chain.

The system works most effectively for TFCs that cycle through the three bands in consecutive symbols and has no effect for TFCs that use only a single band.

In this example the AGC algorithm operates as follows:

1. For each symbol an active window is calculated. This is typically 128 samples, with a short start delay after the nominal symbol start time.

2. The narrowband RSSI is calculated over the active window by counting samples exceeding a first threshold. The minimum is taken of the positive and negative exceed counts and then the maximum taken of I and Q counts. This value is the 6-bit narrowband (NB) RSSI value to be used for the symbol.

3. The NB RSSI is used as a pointer into a 64-entry AGC main lookup table. This implements an inverse erf function and produces a basic 6-bit signed gain change command with a scaling of 1 LSB=3 dB.

4. Over the active window, a signal average is also calculated by accumulating I and Q sample values and shifting by a scaling value from a register (which can be different for the Rx En phase where the window size may be different). Either the I or Q channel average is chosen as the symbol average based on whether I or Q was the maximum when calculating the NB RSSI value.

5. The 6-bit signed symbol average is used as a pointer into the a 64-entry AGC secondary lookup table. This generates a correction value to account for the measured DC offset on the symbol 6. The DC Correction value is applied to the basic gain change using a saturated add. It can optionally be disabled.

7. Two additional thresholds are also used during the active window. Any sample exceeding a second or a third threshold causes a corresponding bit to be set.

8. If a blocker correction option is enabled and the DC Corrected gain change is less than some maximum value (set from a register), then the gain change is modified by adding a first correction if the second threshold has not been exceeded or by adding a second correction if the third threshold has not been exceeded. The result of the addition is also saturated at a maximum value (set from a pre-stored value) and this forms a correction value.

9. At this point a number of limiters are applied to the gain change value. These are all optionally enabled or disabled. One is that if the number of symbols received in the preamble detection phase on the current band has exceeded a pre-set value and the currently applied VGA Gain exceeds another pre-set value then a minimum limit is applied to the gain change. The gain change on the last symbol is therefore set to zero unless a large gain change is required. This ensures that the last symbol can be used for a more accurate DC Offset correction. Another limiter is defines the allowable change from one symbol to the next on the same band. A third limiter prevents a gain decrease if there has already been a gain increase on the current band during the current packet. A gain increase is defined as the final gain change for a band exceeding some value (set from a register) or optionally as the second or third threshold NOT having been exceeded (which usually results in a corrective gain change increase). The gain change is set to a maximum of zero although an optional check allows large decreases to pass unaltered if required.

10. The gain change is applied to the existing gain for the current band that is stored in an index lookup table. A saturated add is used.

11. A further optional limiter is used to cap the gain value at minimum and maximum absolute values.

12. The final update value is written back to the index lookup table for the current band.

13. At this point processing switches to the next symbol and its band. If the AGC gain FIR is enabled then the three values from the index lookup table are read and used as inputs to a simple FIR filter. The result of this band-combining filter is written back to the index lookup table for the new current band.

14. A final lookup stage takes either the FIR output (if enabled) or the appropriate value from the index lookup table and uses it as a pointer into an AGC map lookup table. This maps nominal gain values to individual gain control signals for each of the available gain stages, e.g. filter, VGA and ADC.

15. The gain outputs are registered and their change is synchronised to the analogue processing block. The change should ideally occur during the null period between symbols.

The circuit described above has the advantage that it provides a relatively simple way to perform AGC in parallel with DC offset correction, and in a way that is relatively robust. The thresholds of the threshold detectors 21, 22 could be programmed during operation allows factors such as temperature-dependent effects and deviations in device size or performance from the ideal to be compensated for during operation, but more conveniently they can be kept constant.

The circuit described above is applicable in a receiver that handles a single receive phase, rather than I and Q phase signals, or that handles more than two receive phases. One path for detecting the minimum over a symbol is implemented for each receive phase signal, as in FIG. 4, and if there are more than two of them then the maximum of those minima is passed to the look-up table 26.

Although error functions are the ideal functions for tables 26 and 29 to implement in a typical receiver, they could implement other functions. They could, for example implement a simple linear function albeit with worse performance expected. The functions implemented by the tables could be adapted to compensate for non-linear performance of the amplifier 2 in response to the control input that it receives. However, a linear amplifier is preferred.

Depending on the functions implemented by the look-up tables 26 and 29 the summation unit 27 could be replaced by another unit that forms a suitable AGC output in dependence on the signals from the units 26 and 29. It could, for example, implement a weighted sum or another more complex function depending on the performance of the amplifier 2 and hence on the desired form of the AGC signal.

The summation unit could add digital signals or analogue signals, depending on the outputs from the look-up tables. The outputs from the look-up tables could be converted from digital to analogue by D-to-A converters before they are summed. The output of the summation unit 27 could pass to a D-to-A converter to provide an analogue input to the amplifier 2.

As indicated above, at least preliminary synchronisation is performed before AGC and the setting of DC offset are performed. Synchronisation could be retained from an earlier burst/frame. More preferably, synchronisation is performed on each frame. All the steps of synchronisation may be performed before AGC and DC offset compensation are begun. More efficiently, a preliminary synchronisation step can be performed before AGC and DC offset compensation. Then at the same time as AGC and/or DC offset compensation are being performed synchronisation (specifically timing and frequency lock) can be refined.

In the example above, the signals arrive at the receiver by radio. The present system is applicable to other forms of transmission channel.

Some or all of the receiver can be implemented on a single integrated circuit, on multiple integrated circuits or using discrete components.

The circuit described herein may be implemented in a device that can receive more than one signal simultaneously. For example, it may be able to receive UWB signals and also Bluetooth, GPS or GSM signals; and it may, as described above receive three interleaved UWB signals represented by the three UWB bands of the channel currently in use. However, the processing described herein is performed on a single one of those signals. The circuit described above is especially advantageous for use with UWB signals since they offer a very short training period, but it could also be applied to signals of other protocols.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A signal receiver configured to process two receive phase signals, having a gain control circuit comprising:
    detection means configured to identify for each phase signal: (a) a first number of samples during a part of a training period for which that phase signal exceeds a first threshold, (b) a second number of samples during a part of the training period for which that phase signal is below minus the first threshold, and to determine for each phase signal a respective minimum value that is equal to a smaller of the first and second numbers of samples;
    a first gain stimulus generator configured to generate a first gain stimulus in dependence on the two minimum values;
    averaging means configured to compute an average of the signal received by the receiver during the training period;
    a second gain stimulus generator configured to generate a second gain stimulus in dependence on the average estimated by the averaging means during the training period; and
    a gain control signal generator configured to generate a gain control signal for the receiver in dependence on the first gain stimulus and the second gain stimulus.

2. The receiver as claimed in claim 1, comprising an amplifier for amplifying received signals, the amplifier being configured to apply a level of gain that is dependent on the gain control signal.

3. The receiver as claimed in claim 1, wherein the first gain stimulus generator is configured to generate the first gain stimulus in dependence on a larger of the two minimum values.

4. The receiver as claimed in claim 3, wherein the averaging means is configured to estimate the average of the signal received by the receiver during the training period as being the average over the part of the training period of the phase signal whose minimum value is larger.

5. The receiver as claimed in claim 1, wherein one of the receive phase signals is an in-phase signal and one of the receive phase signals is a quadrature signal.

6. The receiver as claimed in claim 1, wherein the first gain stimulus generator is configured to generate the first gain stimulus such that it is at least approximately proportional to an inverse error function of a representation of excess amplitude.

7. The receiver as claimed in claim 1, wherein the first gain stimulus detector comprises a look-up table configured to output the first gain stimulus in response to receiving a representation of excess amplitude.

8. The receiver as claimed in claim 1, wherein the second gain stimulus detector is configured to generate the second gain stimulus such that it is at least approximately proportional to an error function of the average estimated by the averaging means during the training period.

9. The receiver as claimed in claim 1, wherein the second gain stimulus detector comprises a look-up table configured to output the second gain stimulus in response to receiving the average estimated by the averaging means during the training period.

10. The receiver as claimed in claim 1, wherein the gain control signal generator is configured to generate the gain control signal for the receiver by summing the first gain stimulus and the second gain stimulus.

11. The receiver as claimed in claim 1, comprising means for performing DC offset compensation in dependence on the signal received during the said training period.

12. The receiver as claimed in claim 1, wherein:
    the detection means is configured to identify minimum amplitudes during each of a series of training periods of the signal received by the receiver;
    the first gain stimulus generator is configured to generate a series of first gain stimuli, each being generated in dependence on a minimum amplitude identified by the detection means during a respective training period;
    the averaging means is configured to compute the average of each signal whose gain is to be controlled by the circuit as received by the receiver during each training period;
    the second gain stimulus generator is configured to generate a series of second gain stimuli, each being generated in dependence on the average estimated by the averaging means during a respective training period; and
    the gain control signal generator is configured to generate a series of gain control signals for the receiver in dependence on the first gain stimulus and the second gain stimulus dependent on the signal received during a respective training period.

13. The receiver as claimed in claim 12, wherein the receiver is for receiving signal frames composed of a series of training periods followed by traffic data, and the receiver is configured to use the gain control signal generated by the gain control signal generator in dependence on the first gain stimulus and the second gain stimulus dependent on the signal received during a final training period of a frame for reception of the traffic data of the frame.

14. The receiver as claimed in claim 13, wherein each training period occupies a part of a training symbol of the received signal.

15. The receiver as claimed in claim 1, wherein the receiver is an ultra wide band (UWB) signal receiver.

16. A method for receiving a signal by means of a signal receiver configured to process two receive phase signals, the method comprising:
    identifying for each phase signal: (a) a first number of samples during a part of a training period for which that phase signal exceeds a first threshold, (b) a second number of samples during a part of the training period for which that phase signal is below minus the first threshold, and determining for each phase signal a respective minimum value that is equal to a smaller of the first and second numbers of samples;
    generating a first gain stimulus in dependence on the two minimum values;
    computing an average of the signal received by the receiver during the training period;
    generating a second gain stimulus in dependence on the average estimated during the training period; and
    generating a gain control signal for the receiver in dependence on the first gain stimulus and the second gain stimulus.

* * * * *